US007260593B2

(12) United States Patent
Kim

(10) Patent No.: US 7,260,593 B2
(45) Date of Patent: *Aug. 21, 2007

(54) DEVICE FOR DETERMINING THE RANK OF A SAMPLE, AN APPARATUS FOR DETERMINING THE RANK OF A PLURALITY OF SAMPLES, AND THE $I^{TH}$ RANK ORDERED FILTER

(75) Inventor: Yeong-Taeg Kim, Irvine, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/289,189

(22) Filed: Nov. 28, 2005

(65) Prior Publication Data

US 2006/0112156 A1 May 25, 2006

Related U.S. Application Data

(63) Continuation of application No. 10/954,553, filed on Sep. 30, 2004, now Pat. No. 7,072,928, and a continuation of application No. 10/011,877, filed on Dec. 3, 2001, now Pat. No. 7,072,921.

(60) Provisional application No. 60/257,363, filed on Dec. 20, 2000.

(51) Int. Cl.
*G06F 17/10* (2006.01)
(52) U.S. Cl. ..................................... 708/304
(58) Field of Classification Search ............... 708/207, 708/304
See application file for complete search history.

(56) References Cited

U.S. PATENT DOCUMENTS 3,927,391 A 12/1975 Cantrell ................ 340/146.2

| 4,441,165 A | 4/1984 | Coleman et al. ............ 708/207 |
| 4,567,572 A | 1/1986 | Morris et al. ............... 708/207 |

(Continued)

FOREIGN PATENT DOCUMENTS

| GB | 2 274 366 A | 7/1994 |
| JP | 06-215129 | 8/1994 |
| RU | 2 230 360 C1 | 6/2004 |

OTHER PUBLICATIONS

*A Novel Structure of LWOS Filters Based on Threshold Decomposition*; Ishihara, H. and Taguchi, A.; Dept. of Electron. Eng., Musashi Inst. Of Technology, Tokyo, Japan; Circuits and System II: Analog and Digital Signal Processing, IEEE Transactions on pp. 857-862; Sep. 2001, vol. 48, Issue 9; ISSN: 1057-7130; references cited: 9; CODEN: ICSPES; INSPEC Accession No. 7105142.

(Continued)

*Primary Examiner*—Tan V. Mai
(74) *Attorney, Agent, or Firm*—Kenneth L. Sherman, Esq.; Michael Zarrabian, Esq.; Myers Dawes Andras & Sherman, LLP

(57) ABSTRACT

A rank-determining device determines the rank of a particular sample value from a set of digital sample values by utilizing two different thresholders that are implemented by comparators. The rank of the sample value is decomposed by thresholding the sample value with all of the sample values in the set of digital sample values, and in this manner eliminates the necessity of a sorting operation. This decomposition of the rank will is referred to as self-threshold decomposition. A plurality of these rank-determining devices can be combined to form a rank determining apparatus in order to find the rank of each one of the digital samples in the set of digital samples. Because the rank-determining apparatus implements self-threshold decomposition, rank- and order-statistic based filters, such as the median filter, can be realized in a feasible manner.

7 Claims, 5 Drawing Sheets

U.S. PATENT DOCUMENTS

| | | | | |
|---|---|---|---|---|
| 4,958,141 | A | 9/1990 | Engelsman | 340/146.2 |
| 5,315,171 | A | 5/1994 | Blauer et al. | 327/71 |
| 5,408,675 | A | 4/1995 | Florentino et al. | 715/800 |
| 5,532,948 | A | 7/1996 | Kohno et al. | 708/207 |
| 5,737,251 | A | 4/1998 | Kohno et al. | 708/207 |
| 6,208,764 | B1 | 3/2001 | Archer et al. | 382/260 |
| 6,331,859 | B1 * | 12/2001 | Crinon | 345/619 |
| 6,446,101 | B1 | 9/2002 | Braun | 708/207 |

OTHER PUBLICATIONS

*Semiparallel Rank Order Filtering in Analog VLSI*; Boon Poh Tan; Wilson, D.M.; Sch. Of Elct. Eng., Washington University, Seattle, WA, USA; Circuits and Systems II: Analog and Digital Signal Processing, IEEE Transaction on pp. 198-205, Feb. 2001; vol. 48 Issue 2, ISSN: 1057-7130; References cited: 11; CODEN: ICSPES; INSPEC Accession No. 6910474.

*A Sampled-Analog Rank-Order-Filter Architecture*; Cilingiroglu, U.; Edem Dake, L.; Texas A7M; University; Electronics, Circuits and Systems, 2001. IDECS 2001; the 8th IEEE International Conference on pags. 173-176; Sep. 2-5, 2001; vol. 1, ISBN 0-7803-7057-0.

* cited by examiner

DEVICE FOR DETERMINING THE RANK OF A SAMPLE, AN APPARATUS FOR DETERMINING THE RANK OF A PLURALITY OF SAMPLES, AND THE I$^{TH}$ RANK ORDERED FILTER

This application is a Continuation Patent Application under 35 USC §120 of U.S. patent application Ser. No. 10/954,553 filed Sep. 30, 2004, now U.S. Pat. No. 7,072,928 issued Jul. 4, 2006, which in turn claims priority, as does this application from U.S. patent application Ser. No. 10/011,877 filed Dec. 3, 2001, now U.S. Pat. No. 7,072,921 issued Jul. 4, 2006, which in turn, as does this application, claims priority under 35 USC §119(e) from U.S. Provisional Patent Application Ser. No. 60/257,363 filed Dec. 20, 2000.

CROSS-REFERENCE TO RELATED APPLICATION

Applicant claims the benefit of U.S. Provisional Application No. 60/257,363 entitled "Method and Apparatus For Data Ranking Based on Threshold Decomposition," filed Dec. 20, 2000, which application is incorporated herein by reference.

BACKGROUND OF THE INVENTION

Field of the Invention

The present invention relates to a device for determining the rank of a particular one of a given set of digital samples. The invention also relates to an apparatus for determining the rank of each one of the samples in the set, and to a median filter for filtering the set of samples that incorporates such an apparatus. Self-threshold decomposition is utilized so that the median filter can be realized in a feasible manner.

Linear filters have been widely used in many industrial applications due to their simple mathematical operation and simple H/W (hardware) structures. In order to overcome some drawbacks of linear filters that arise in many areas, much attention has been directed towards developing non-linear digital filters that utilize rank- and order-statistics. It is well known that linear filters perform poorly in the presence of outliers. For example, when an image is degraded by an impulsive noise, or a noise with a heavy-tailed distribution, applying a Wiener filter, which is the optimal linear filter under the mean squared estimation error (MSE) criterion, tends to blur the image since it smears out an important visual cue such as an edge of the image while it suppresses the impulsive noise.

To deal with this poor performance of a linear filter in the presence of outliers, filters that are based on rank- and order-statistics and that have theoretical backgrounds based in statistics have been studied for the last decades. Median filtering is the simplest and probably the most well-known example of rank-order filtering, which can suppress the outliers effectively while preserving image detail.

As a second example, equalizers are indispensable in digital TV receiving systems to reduce the degradation of a system due to multi-path transmission or inter-symbol interference. However, an equalizer that is based on a combination of linear-type filters loses its performance when an impulsive noise is present in a channel. Error correction coding schemes are typically used to recover a symbol error or an alphabet error. This method, however, is limited in its use simply because of the H/W growth of the error correction system with respect to the number of symbols, or the number of alphabets that can be corrected. An impulsive type noise can be easily dealt with if we use a filter that is based on rank- and order-statistics and this has been verified in much literature on the topic. Thus, the combination of an impulse remover and an equalizer will increase the performance of a digital communication system remarkably in terms of the bit error rate or symbol error rate.

In spite of the successful development of a class of filters that is based on rank- and order-statistics in theory, they have rarely been used in real industrial applications because of the high complexity of the associated H/W. In order to realize those filters, sorting and ranking of the input samples are fundamental.

SUMMARY OF THE INVENTION

It is accordingly an object of the invention to provide a device for determining the rank of a particular one of a given set of digital sample values. It is also an object of the invention to provide an apparatus that incorporates a plurality of such rank-determining devices so that the ranks of each one of the sample values in the set can be determined. Additionally, it is an object of the invention to provide the i$^{th}$ rank ordered filter for filtering the set of sample values. The i$^{th}$ rank ordered filter incorporates the rank-determining apparatus.

The rank-determining device determines the rank of a particular one of the sample values by utilizing two different thresholders that are implemented by comparators. The rank of the sample is decomposed by thresholding the sample value with all of the sample values in the set of digital sample values, and in this manner eliminates the necessity of a sorting operation. This decomposition of the rank will be described in more detail below and will be referred to as self-threshold decomposition. A plurality of these rank-determining devices can be combined to form a rank determining apparatus in order to find the rank of each one of the digital samples in the set of digital samples. Because the rank-determining apparatus implements self-threshold decomposition, rank- and order-statistic based filters, such as the median filter, can be realized in a feasible manner.

With the foregoing and other objects in view there is provided, in accordance with the invention, a device for determining the rank of one of a plurality of sample values. The rank-determining device includes an adder having an output providing a result that indicates the rank of a particular one of the plurality of the sample values. The rank-determining device includes at least one comparator of a first type having a first input and a second input. The second input receives the particular one of the plurality of the sample values. The first input receives another one of the plurality of the sample values. The comparator of the first type has an output that provides an output signal representing a logic one if the other one of the plurality of the sample values is not greater than the particular one of the plurality of the sample values. The output signal represents a logic zero otherwise. The rank-determining device also includes at least one comparator of a second type. The comparator of the second type has a first input and a second input. The second input of the comparator of the second type receives the particular one of the plurality of the sample values. The first input of the comparator of the second type receives yet another one of the plurality of the sample values. The comparator of the second type has an output that provides an output signal representing a logic one if the yet another one of the plurality of the sample values is less than the particular one of the plurality of the sample values. The output signal that is provided by the output of the comparator of the second type represents a logic zero otherwise. The adder adds together a logic one, the output signal from the output of the comparator of the first type, and the output signal from the output of the comparator of the second type to obtain the result that indicates the rank of the particular one of the plurality of the sample values. The output of the adder provides the result.

In accordance with an added feature of the invention, there is provided, a further comparator of the first type that has a first input and a second input. The second input of the further comparator receives the particular one of the plurality of the sample values. The first input of the further comparator receives a further one of the plurality of the sample values. The further comparator has an output providing an output signal representing a logic one if the further one of the plurality of the sample values is not greater than the particular one of the plurality of the sample values. The output signal of the further comparator represents a logic zero otherwise. The adder adds the output signal from the output of the further comparator to the result that indicates the rank of the particular one of the plurality of the sample values.

In accordance with an additional feature of the invention, there is provided, a further comparator of the second type that has a first input and a second input. The second input of the further comparator receives the particular one of the plurality of the sample values. The first input of the further comparator receives a further one of the plurality of the sample values. The further comparator has an output that provides an output signal representing a logic one if the further one of the plurality of the sample values is less than the particular one of the plurality of the sample values. The output signal of the further comparator represents a logic zero otherwise. The adder adds the output signal from the output of the further comparator to the result that indicates the rank of the particular one of the plurality of the sample values.

In accordance with another feature of the invention, the rank-determining device is configured in combination with a plurality of analog to digital converters that are configured to sample a plurality of signals at a particular instant of time to obtain the plurality of the sample values.

In accordance with a further feature of the invention, the rank-determining device is configured in combination with a memory that has stored the plurality of the sample values.

The structure of the rank-determining device will depend upon the total number of sample values (n sample values) and upon the particular one of the sample values for which the rank is to be determined. The rank-determining device receives n sample values and determines the rank of the $i^{th}$ one of the n sample values.

The rank-determining device, therefore, includes an adder having an output providing a result indicating the rank of the $i^{th}$ one of the n sample values. The rank-determining device also includes a number of comparators of a first type. Each one of the comparators of the first type has a first input that receives a respective sample value that is selected from the group consisting of sample values beginning with a first one of the n sample values and ending with the $i-1^{th}$ one of the n sample values. Each one of the comparators of the first type has a second input that receives the $i^{th}$ one of the n sample values. Each one of the comparators of the first type has an output that provids an output signal representing a logic one if the respective sample value at the first input is not greater than the $i^{th}$ one of the n sample values and representing a logic zero otherwise.

The rank-determining device also includes a number of comparators of a second type. Each one of the comparators of the second type has a first input that receives a respective sample value that is selected from the group consisting of sample values beginning with the $i+1^{th}$ one of the n sample values and ending with the $n^{th}$ one of the n sample values. Each one of the comparators of the second type has a second input receiving the $i^{th}$ one of the n sample values. Each one of the comparators of the second type has an output providing an output signal representing a logic one if the respective sample value at the first input is less than the $i^{th}$ one of the n sample values and representing a logic zero otherwise.

The adder adds together a logic one, the output signal from the output of each one of the comparators of the first type, and the output signal from the output of each one of the comparators of the second type to obtain the result that indicates the rank of the $i^{th}$ one of the n sample values. The output of the adder provides the result that indicates the rank of the $i^{th}$ one of the n sample values.

The number of the comparators of the first type is equal to i−1 and will equal zero when the $i^{th}$ one of the n sample values is the first one of the n sample values. The number of the comparators of the second type is equal to n−i and will equal zero when the $i^{th}$ one of the n sample values is the $n^{th}$ one of the n sample values.

With the foregoing and other objects in view there is also provided, in accordance with the invention, an apparatus for receiving n sample values and for determining the rank of each one of the n sample values. The rank-determining apparatus includes a plurality of rank-determining devices. Each one of the plurality of the rank-determining devices utilizes self-threshold decomposition to determine the rank of a respective one of the n sample values.

With the foregoing and other objects in view there is also provided, in accordance with the invention, the $i^{th}$ rank ordered filter that includes a rank-determining device utilizing self-threshold decomposition to find the ranks of a plurality of sample values. The $i^{th}$ rank ordered filter also includes a weighting device having an input for receiving an integer value. The weighting device has inputs that are connected to the rank-determining device for receiving the ranks of the plurality of the sample values. The weighting device has inputs for receiving the plurality of the sample values. The weighting device also has an output providing a value that is equal to one of the plurality of the sample values which has a rank that is equal to the integer value.

In accordance with a concomitant feature of the invention, the weighting device weights only one of the ranks of the plurality of the sample values with a non-zero integer value so that the one of the plurality of the sample values which has a rank equal to the integer value will be provided at the output.

DESCRIPTION OF THE PREFERRED EMBODIMENTS

Figure 1:
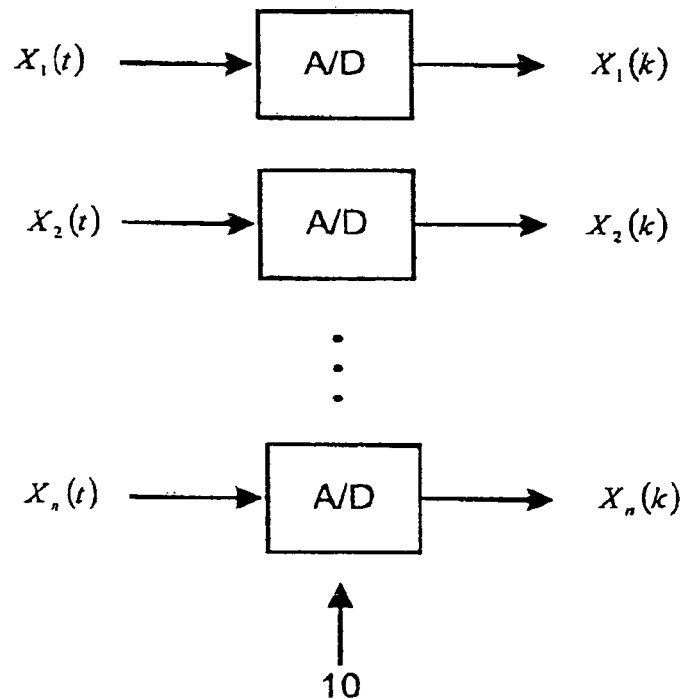
FIG. 1 shows a plurality of analog/digital converters for sampling a plurality of input signals at a given instant of time.

The invention is based upon developing a method for computing the rank of a particular digital sample by using a combination of two different thresholders such that a sorting operation is not necessary. This method is then taken into account when constructing a device for determining the rank of the sample. As a prelude to developing the method, information relating to the ranking process will now be described.

Sorting and ranking processes are intended to sort and rank given input samples according to their values. The present disclosure relates to a ranking process which ranks given input samples in ascending order of their sample values. As an example of the sorting and ranking processes, let us consider that three samples $\{5, -6, 2\}$ have been obtained which are to be sorted and ranked. If we rearrange the samples in ascending order, we obtain $\{-6, 2, 5\}$. Based on this sorted data, the samples 5, -6, and 2 are ranked as 3, 1, and 2, respectively, which implies that 5 is the largest sample, -6 is the smallest sample, and 2 is the second smallest sample among $\{5, -6, 2\}$. Thus, the sorting implies an operation which rearranges $\{5, -6, 2\}$ as $\{-6, 2, 5\}$ whereas the ranking implies an operation which ranks $\{5, -6, 2\}$ as $\{3, 1, 2\}$ based on their sample values.

To describe the ranking process mathematically, let $(X_1(k), X_2(k), \ldots, X_n(k))$ denote the given input samples at the kth time interval, and let $(Y_1(k), Y_2(k), \ldots, Y_n(k))$, denote the sorted version of those input samples in ascending order. Based on this notation, the sorting process can be expressed as the mapping:

$$(X_1(k), X_2(k), \cdots, X_n(k)) \stackrel{map}{\rightarrow} (Y_1(k), Y_2(k), \cdots, Y_n(k)) \qquad (1)$$

where the sorted samples satisfy:

$$Y_1(k) \leq Y_2(k) \leq \ldots \leq Y_n(k) \qquad (2)$$

in which $Y_i(k)$, for $i=1, 2, \ldots, n$, is the ith smallest sample of $(X_1(k), X_2(k), \ldots, X_n(k))$. $Y_i(k)$ is typically known as the ith order statistic. Based on the sorting described in (1), the rank of $X_i(k)$, denoted by $r_i$, is defined as:

$$r_i(k)=j, \text{ if } X_i(k)=Y_j(k) \qquad (3).$$

As can be seen from (2), the rank $r_i(k)$ basically indicates the number of samples in $(X_1(k), X_2(k), \ldots, X_n(k))$ that are smaller than or equal to $X_i(k)$.

It should be noted here that, however, that there are some cases in which the determination of the rank of a sample defined by (2) and (3) is ambiguous. In other words, when some samples in $(X_1(k), X_2(k), \ldots, X_n(k))$ are tied, or, equally valued, the way of assigning rank to each sample is not unique. For instance, consider that two samples $X_a(k)$ and $X_b(k)$ in $(X_1(k), X_2(k), \ldots, X_n(k))$ are valued equally, i.e., $X_a(k)=X_b(k)$ where $a \neq b$. According to the sorting that is defined in (1) and (2), we can sort these samples either as $X_a(k) \leq X_b(k)$, or as $X_b(k) \leq X_a(k)$, and the subsequent ranks of those samples are different. In the case of sorting them as $X_a(k) \leq X_b(k)$, the rank of $X_b(k)$ is greater than the rank of $X_a(k)$ by one, by definition. On the contrary, the rank of $X_a(k)$ is greater than the rank of $X_b(k)$ by one if we sort them as $X_b(k) \leq X_a(k)$. As a consequence, it is not unique to determine the ranks of those samples in this example. This kind of ambiguity increases as the number of equal valued samples in $(X_1(k), X_2(k), \ldots, X_n(k))$ increases. The reason for such an ambiguity is due to the fact that the ordering of two equal valued samples is not uniquely defined in (2).

Such an ambiguity can be avoided by introducing a method called stable sorting in which the sequential ordering of equal-valued samples is also preserved when the samples are arranged in accordance with (1) and (2). That is, the samples that are equally valued can be sorted in a unique fashion by further considering their order of appearance in $(X_1(k), X_2(k), \ldots, X_n(k))$. In order to formulate the ranking process based on the stable sorting systematically, we define the ordering relation "<<" between two samples $X_j(k)$ and $X_i(k)$ as:

$$(X_j(k) << X_i(k)) \leftrightarrow (X_j(k) < X_i(k), \text{ or, } j \leq i \text{ if } X_j(k)=X_i(k)) \qquad (4)$$

which is equivalent to:

$$(X_j(k) << X_i(k)) \leftrightarrow \begin{cases} X_j(k) \leq X_i(k), & \text{if } j \leq i \\ X_j(k) < X_i(k), & \text{if } j > i \end{cases} \qquad (5)$$

or, equivalent to:

$$(X_j(k) << X_i(k)) \leftrightarrow \begin{cases} X_j(k) \leq X_i(k), & \text{if } j = 1, 2, \cdots, i \\ X_j(k) < X_i(k), & \text{if } j = i+1, i+2, \cdots, n \end{cases} \qquad (6)$$

Note that $X_j(k) << X_j(k)$ by definition.

Using the ordering relation that is defined in (4), (5), or in (6), the stable sorting operation can be expressed as the mapping:

$$(X_1(k), X_2(k), \cdots, X_n(k)) \stackrel{map}{\rightarrow} (Y_1(k), Y_2(k), \cdots, Y_n(k)) \qquad (7)$$

where the sorted samples now satisfy:

$$Y_1(k) << Y_2(k) << \ldots << Y_n(k) \qquad (8)$$

Note that the arrangement of the samples $X_1(k), X_2(k), \ldots, X_n(k)$ according to the stable sorting in (8) is unique.

Based on the stable sorting defined above, the rank of $X_i(k)$, $r_i(k)$, is now re-defined as:

$$r_i(k)=j, \text{ if } X_i(k)=Y_j(k) \qquad (9).$$

Hence, in stable sorting, when $X_a(k)=X_b(k)$, $X_b(k)$ is ranked higher than $X_a(k)$ if $a<b$, and $X_a(k)$ is ranked higher than $X_b(k)$ if $b<a$.

For a better understanding of stable sorting, let us consider the example addressed above again. That is, suppose we have $(X_1, X_2, X_3, X_4, X_5)=(5, 3_2, 7, 4, 3_5)$ where $3_2$ denotes the sample valued 3 at the second position and $3_5$ denotes the sample valued 3 at the fifth position. If we do stable sorting for those samples based on (8), we obtain $(Y_1, Y_2, Y_3, Y_4, Y_5)=(X_2, X_5, X_4, X_1, X_3)=(3_2, 3_5, 4, 5, 7)$ since $3_2<<3_5<<4<<5<<7$. Thus, the ranks of $X_1, X_2, X_3, X_4, X_5$ are given as 4, 1, 5, 3, 2, respectively.

It should be noted that the rank $r_i(k)$ defined in (9) substantially represents the number of samples $X_j(k) \in \{X_1(k), X_2(k), \ldots, X_n(k)\}$ that satisfy $X_j(k) << X_i(k)$. In order to express such a rank of $X_i(k)$, we define the function $f(a, b)$, which compares b with a based on the ordering relation "<<", as:

$$f(a, b) = \begin{cases} 1, & \text{if } a << b \\ 0, & \text{otherwise} \end{cases} \quad (10)$$

Then the rank $r_i(k)$ can be simply expressed as $$r_i(k) = \sum_{j=1}^{n} f(X_j(k), X_i(k)). \quad (11)$$

The sample $X_i(k)$ by $X_j(k) << X_i(k)$ is as stated above. By using the relation given in (6) the term in (11) becomes:

$$f(X_j(k), X_i(k)) = \begin{cases} 1, & \text{if } X_j(k) \leq X_i(k) \text{ for } j = 1, 2, \cdots, i \\ 1, & \text{if } X_j(k) < X_i(k) \text{ for } j = i+1, i+2, \cdots, n, \\ 0, & \text{otherwise} \end{cases} \quad (12)$$

Thus, $r_i(k)$ can be written as:

$$r_i(k) = \sum_{j=1}^{n} f(X_j(k), X_i(k)) \quad (13)$$

$$= \sum_{j=1}^{i} f(X_j(k), X_i(k)) + \sum_{j=i+1}^{n} f(X_j(k), X_i(k)) \quad (14)$$

$$= \sum_{j=1}^{i} f_u(X_j(k), X_i(k)) + \sum_{j=i+1}^{n} f_l(X_j(k), X_i(k)), \quad (15)$$

where $f_u(X_j(k), X_i(k))$ and $f_l(X_j(k), X_i(k))$ are defined as:

$$f_u(X_j(k), X_i(k)) = \begin{cases} 1, & \text{if } X_j(k) \leq X_i(k) \\ 0, & \text{otherwise} \end{cases} \quad (16)$$

and $$f_l(X_j(k), X_i(k)) = \begin{cases} 1, & \text{if } X_j(k) < X_i(k) \\ 0, & \text{otherwise} \end{cases}. \quad (17)$$

If we use the fact that $f_u(X_i(k), X_i(k))=1$ by definition, the rank $r_i(k)$ that was derived in (15) can be expressed as:

$$r_i(k) = \sum_{j=1}^{i-1} f_u(X_j(k), X_i(k)) + 1 + \sum_{j=i+1}^{n} f_l(X_j(k), X_i(k)). \quad (18)$$

The expression we have derived in (18) when combined with (16) and (17) indicates a method of computing the rank of a sample, which is among a number of given data samples n, through a combination of two different thresholders without utilizing a sorting operation. The relation given in (15) indicates that the rank $r_i(k)$ can be decomposed by thresholding the sample $X_i(k)$ with all of the samples to be ranked. For this reason, the decomposition of a rank utilizing the thresholding operations in (15) will be referred to as the self-threshold decomposition.

Let us now develop a device for determining the rank of a digital sample $X_i(k)$ that is one of a set or group of n digital samples $X_1(k)$ through $X_n(k)$. The n digital samples could be obtained, for example, by sampling a plurality (n) of analog input signals $X_i(t)$ at a given instant of time as shown in FIG. 1. FIG. 1 shows that a respective digital/analog converter 10 has been provided for each one of the analog input signals $X_i(t)$.

Figure 2:
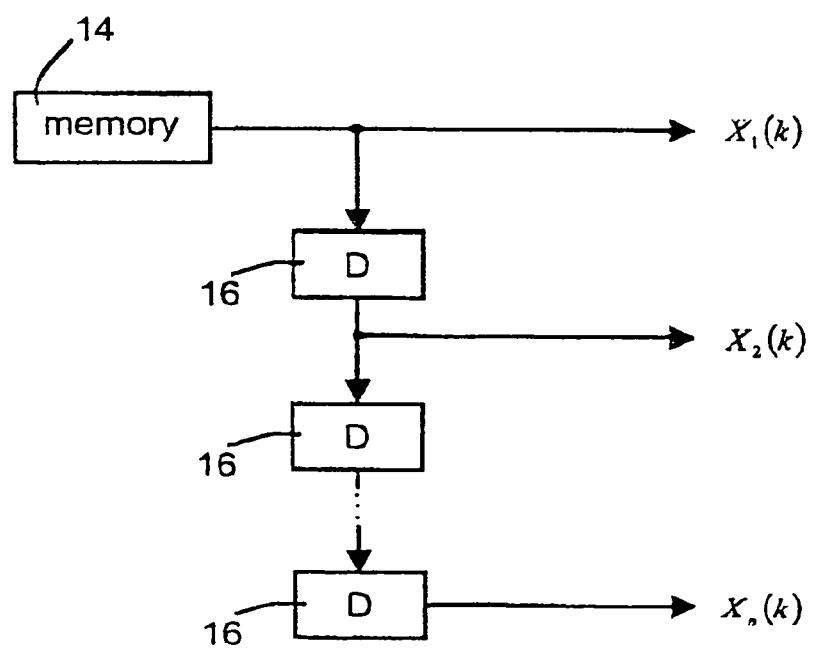
FIG. 2 shows a memory having stored therein a plurality of samples.

FIG. 2 shows a digital memory 14 in which the digital samples $X_1(k)$ through $X_n(k)$, which have been previously obtained, are stored. The samples $X_1(k)$ through $X_n(k)$ are then stored in registers 16 upon being read out from the memory 14 and are available for inputting into one or more further devices.

Figure 3:
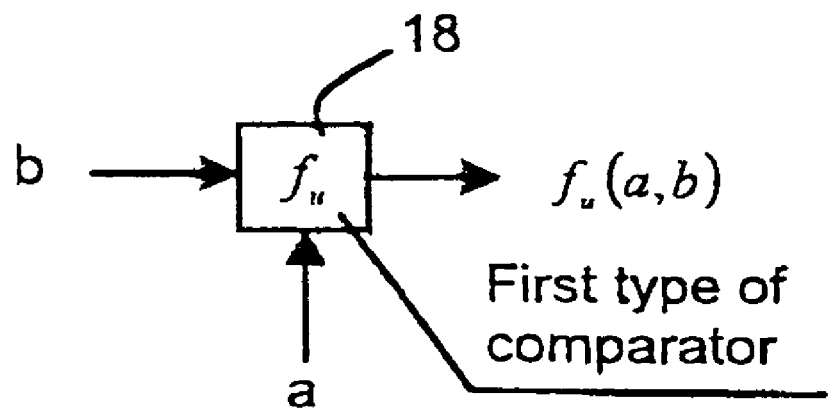
FIG. 3 shows a first type of comparator.
Figure 4:
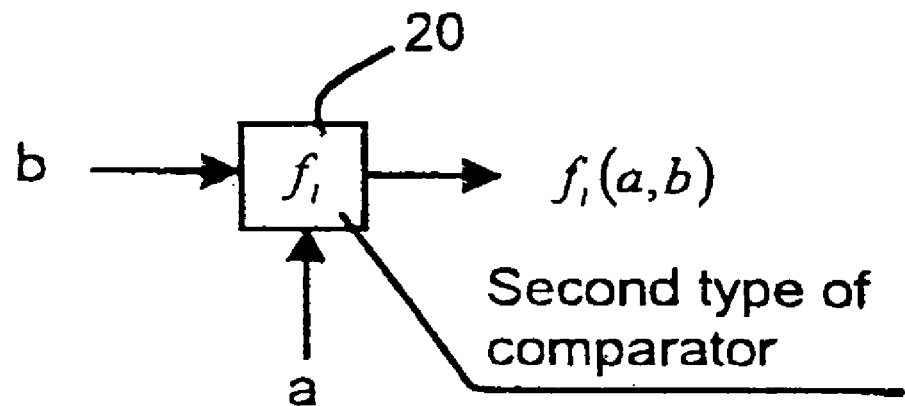
FIG. 4 shows a second type of comparator.

FIG. 3 shows a first type of comparator 18 that is used to implement the function expressed by equation (16). FIG. 4 shows a second type of comparator 20 that is used to implement the function expressed by equation (17). With both the first type of comparator 18 and the second type of comparator 20, the input labeled with "a" receives the signal represented by $X_j(k)$ in equations (16 and 17) and the input labeled with "b" receives the signal represented by $X_i(k)$.

Figure 5:
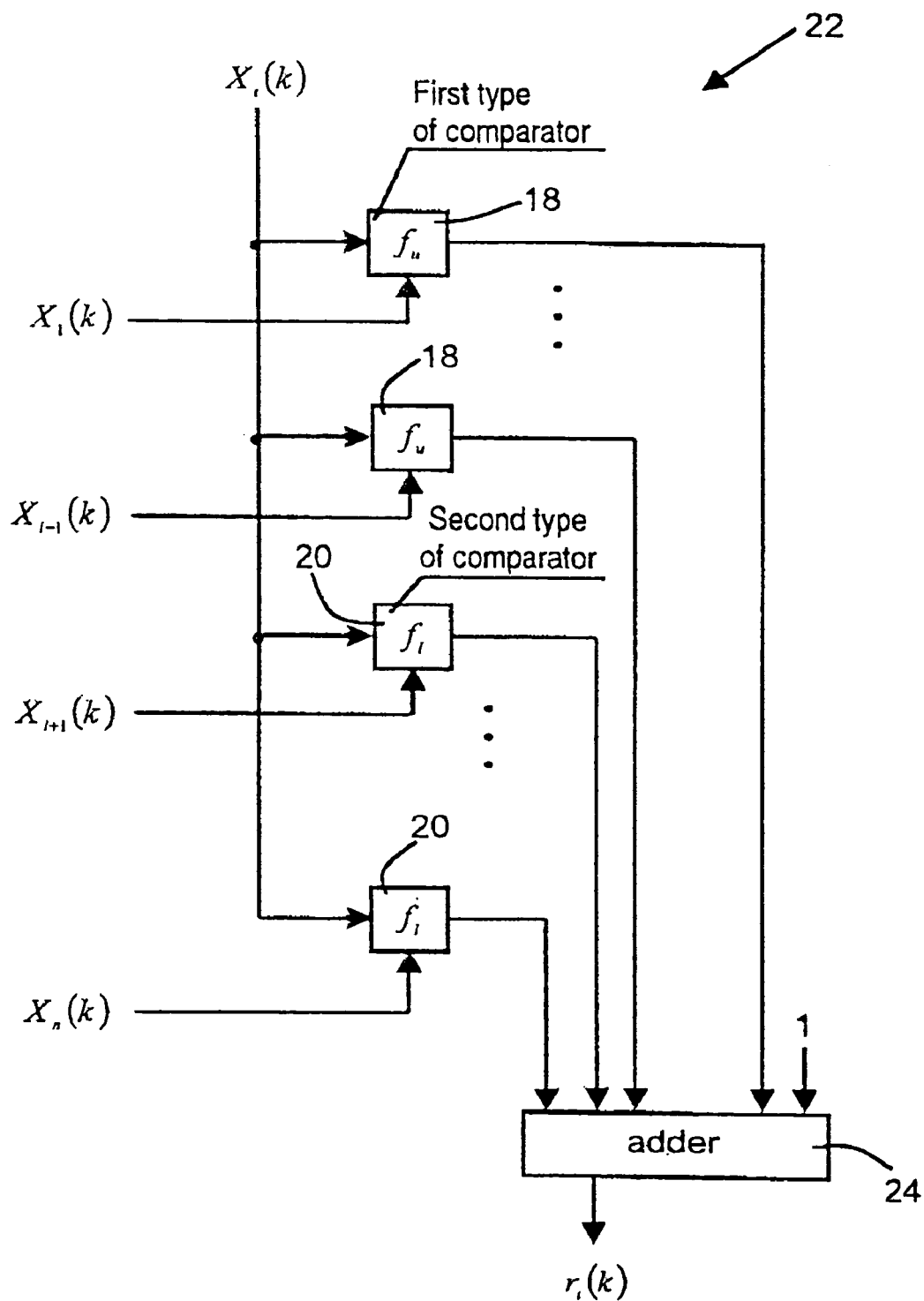
FIG. 5 shows a rank determining device for determining the rank of a sample.

Referring to FIG. 5, it can be seen that the first type of comparators 18 and the second type of comparators 20 form the basic building blocks of a rank determining device 22 for determining the rank of one $X_i(k)$ of the n digital samples. Although two of the first type of comparators 18 and two of the second type of comparators 20 are shown, the actual number of the first type of comparators 18 and of the second type of comparators 20 will vary depending upon the total number of the n samples and the particular one $X_i(k)$ of the n samples for which the rank $r_i(k)$ is to be determined. An adder 24 has an output providing a result that indicates the rank $r_i(k)$ of the one $X_i(k)$ of the n digital samples. In order to obtain the result, which indicates the rank $r_i(k)$, the adder 24 adds together: a logic one, the output from each one of the first type of comparators 18 and the output from each one of the second type of comparators 20.

As previously mentioned, the actual number of the first type of comparators 18 and the actual number of the second type of comparators 20 will vary depending upon the total number of the n digital samples and upon the particular one $X_i(k)$ of the n digital samples for which the rank $r_i(k)$ is to be determined. The number of the first type of comparators 18 is equal to i−1 and equals zero when the $i^{th}$ one of the n digital samples is the first one of the n digital samples. The number of the second type of comparators 20 is equal to n−i and equals zero when the $i^{th}$ one of the n digital samples is the last one of the n digital samples.

For example, let us consider the case when there are are three digital samples and it is desired to find the rank $r_2(k)$ of the second digital sample. In this case, there will be one of the first type of comparators 18 and one of the second type of comparators 20. The adder 24 will provide a result, which indicates the rank $r_2(k)$ of the second digital sample, by adding together: a logic one, the output from the one of the first type of comparators 18 and the output from the one of the second type of comparators 20.

Let us now consider the case when there are are three digital samples and it is desired to find the rank $r_3(k)$ of the third digital sample. In this case, there will be two of the first type of comparators 18 and none of the second type of comparators 20. The adder 24 will provide a result, which indicates the rank $r_3(k)$ of the third digital sample, by adding together: a logic one and the outputs from the two comparators 20 of the second type.

Let us also consider the case when there are are three digital samples and it is desired to find the rank $r_1(k)$ of the first digital sample. In this case, there will be two of the second type of comparators 20 and none of the first type of comparators 18. The adder 24 will provide a result, which indicates the rank $r_1(k)$ of the first digital sample, by adding together: a logic one and the and the outputs from the two comparators 18 of the first type.

Figure 6:
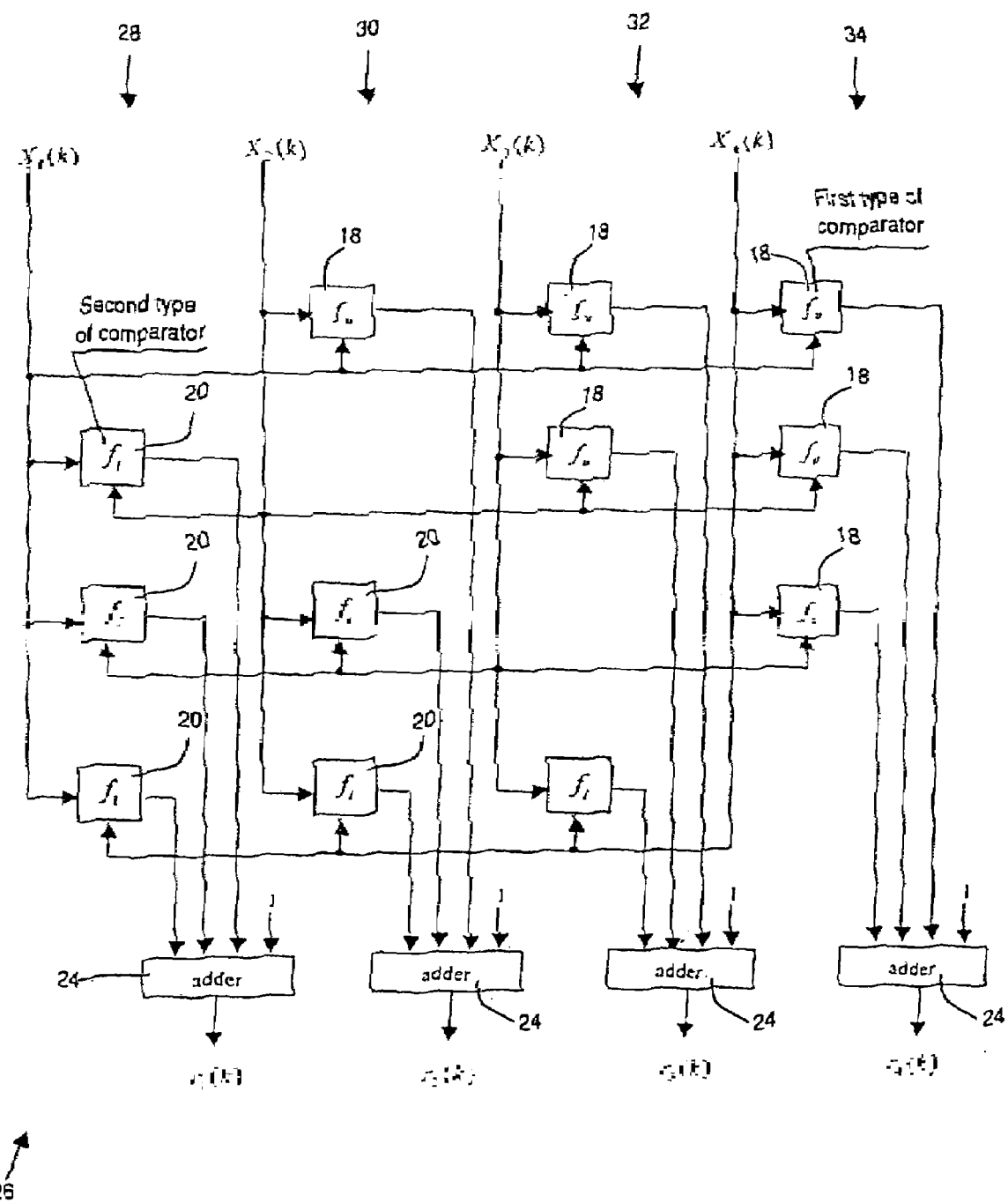
FIG. 6 shows a rank determining apparatus for determining the rank of each one of a plurality of samples.

It should be understood that the rank-determining device 22 could be provided for each one of n digital samples so that the rank $r_i(k)$ of each one of the n digital samples will be obtained. FIG. 6 shows an apparatus 26 for calculating the rank of each one of n digital samples. In this example, we have selected the case when there are four digital samples, in other words when n=4, although it should be understood that n could equal any desired finite value. The apparatus 26 includes a first rank determining device 28 for determining the rank $r_1(k)$ of the first digital sample, a second rank determining device 30 for determining the rank $r_2(k)$ of the second digital sample, a third rank determining device 32 for determining the rank $r_3(k)$ of the third digital sample, and a fourth rank determining device 34 for determining the rank $r_4(k)$ of the first digital sample.

An apparatus 26 for determining the ranks $r_i(k)$ of n digital samples can be used to implement an Order-Statistic. There are several kinds of non-linear filters that are based on Order-Statistic Filters. Such non-linear filters have many applications that are well known. Perhaps the most common kind of Order-Statistic Filter is the median filter whose output is the median of the input digital samples. In fact, the median filter is a special case of the $i^{th}$ rank ordered filter that can be expressed as $$F^i(k)=Y_i(k):$$

where i can be 1, 2, and so on up to n.

If i=1, $F^i(k)$ becomes the Min filter, if i=n, $F^i(k)$ becomes the Max filter, and if $$i = \frac{n+1}{2},$$

$F^i(k)$ becomes the Median filter where we assume that n is an odd number.

Figure 7:
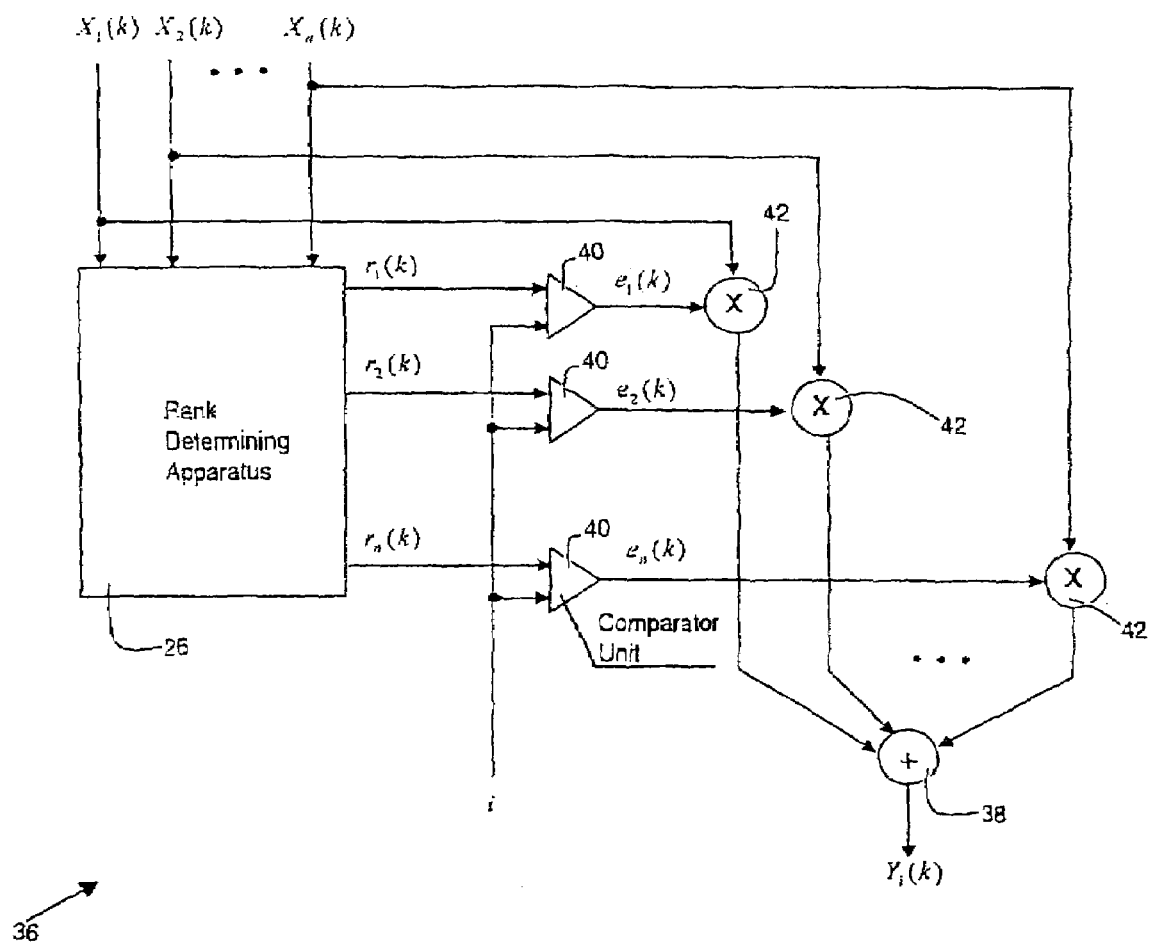
FIG. 7 shows an $i^{th}$ rank ordered filter.

FIG. 7 shows the $i^{th}$ rank ordered filter 36 that is implemented using the rank determining apparatus 26.

The output of adder 38 is expressed as:

$$F^i(k) = \sum_{j=1}^{n} e_j(k) \cdot X_j(k);$$

where:

$$e_j(k) = \begin{cases} 1 & \text{if } r_j(k) = i \\ 0 & \text{otherwise} \end{cases}$$

Thus, the output of the adder 38 basically tells which one $X_i(k)$ of the n input digital samples has the rank of i. Note that only one element of $(e_i(k), e_e(k), \ldots, e_n(k))$ has a value of 1 and the others are all zeros. The location of the nonzero valued element is the location of the input sample whose rank is i. So, it can be shown that:

$$F^i(k) = \sum_{j=1}^{n} e_j(k) \cdot X_j(k) = Y_i(k).$$

The $i^{th}$ rank ordered filter 36 includes comparator units 40 that output a logic one when the values at each of its inputs are equal. In this manner, the comparator units 40 are used to implement the function:

$$e_j(k) = \begin{cases} 1 & \text{if } r_j(k) = i \\ 0 & \text{otherwise} \end{cases}$$

One input of each one of the comparator units 40 receives the value i, and the other input receives a respective one of the ranks $r_i(k)$ that have been determined by the rank determining apparatus 26. A respective multiplier 42 is used to multiply the output of each comparator unit 40 with the value of the respective one $X_i(k)$ of the n digital samples. The outputs of all of the multipliers 42 are summed by the adder 38 to provide the value of the sample having the desired rank i. The only comparator unit 40 to output a logic one is the one for which the input rank $r_i(k)$ equals the input integer i. Therefore, the only sample contributing a non-zero value to the summation that is performed by the adder 38 is the sample having the rank of i.

What is claimed is:

1. A rank ordered filter, comprising:
   a rank-determining device that finds ranks of a plurality of sample values; and
   a weighting device that based on the sample values and ranks of the plurality of the sample values, provides a value equal to one of the plurality of the sample values with a rank that is equal to an integer value.

2. The rank ordered filter of claim 1 wherein the rank-determining device further utilizes self-threshold decomposition to find ranks of the plurality of sample values.

3. The rank ordered filter of claim 2 wherein:
   the weighting device has an input for receiving an integer value, said weighting device having inputs connected to said rank-determining device for receiving the ranks of the plurality of the sample values, said weighting device having inputs for receiving the plurality of the sample values; and
   said weighting device having an output providing a value that is equal to one of the plurality of the sample values which has a rank that is equal to the integer value.

4. The rank ordered filter of claim 3 wherein said weighting device weights only one of the ranks of the plurality of the sample values with a non-zero integer value so that the one of the plurality of the sample values which has a rank equal to the integer value will be provided at said output.

5. The rank ordered filter of claim 3 wherein:
   the plurality of sample values comprise n sample values;
   said rank-determining device utilizes self-threshold decomposition to determine a rank of a respective one of the n sample values, wherein the respective one of the n sample values defines an $i^{th}$ one of the n sample values;
   the rank-determining device further comprises:
     an adder having an output providing a result indicating the rank of the $i^{th}$ one of the n sample values;
     a number of comparators of a first type, each one of said comparators of said first type having a first input receiving a respective sample value selected from the group consisting of sample values beginning with a first one of the n sample values and ending with an $i-1^{th}$ one of the n sample values, each one of said comparators of said first type having a second input receiving the $i^{th}$ one of the n sample values, each one of said comparators of said first type having an output providing an output signal representing a logic one if the respective sample value at said first input is not greater than the $i^{th}$ one of the n sample values and representing a logic zero otherwise; and a number of comparators of a second type, each one of said comparators of said second type having a first input receiving a respective sample value selected horn the group consisting of sample values beginning with an $i+1^{th}$ one of the n sample values and ending with an nth one of the n sample values, each one of said comparators of said second type having a second input receiving the $i^{th}$ one of the n sample values, each one of said comparators of said second type having an output providing an output signal representing a logic one if the respective sample value at said first input is less than the $i^{th}$ one of the n sample values and representing a logic zero otherwise;

said adder of said one of said plurality of said rank determining devices adding together a logic one, said output signal from said output of each one of said comparators of said first type belonging to said one of said plurality of said rank determining devices, and said output signal from said output of each one of said comparators of said second type belonging to said one of said plurality of said rank determining devices to obtain the result indicating the rank of the $i^{th}$ one of the n sample values, said output of said adder of said one of said plurality of said rank determining devices providing the result;

the number of said comparators of said first type belonging to said one of said plurality of said rank determining devices is equal to $i-1$ and equal to zero when the $i^{th}$ one of the n sample values is the first one of the n sample values; and the number of said comparators of said second type belonging to said one of said plurality of said rank determining devices is equal to $n-i$ and equal to zero when the $i^{th}$ one of the n sample values is the nth one of the n sample values.

6. The rank ordered filter of claim 3 wherein:

the plurality of sample values comprise n sample values;

said rank-determining device utilizes self-threshold decomposition to determine a rank of a respective one of the n sample values, wherein the respective one of the n sample values defines an $i^{th}$ one of the n sample values;

the rank-determining device further comprises:

a first device for determining a rank of a last one of the n sample values, said first device includes:

an adder having an output providing a result indicating the rank of the last one of the n sample values; and at least two comparators of a first type, each one of said at least two comparators of said first type having a first input and a second input, said first input of each one of said at least two comparators of said first type receiving a respective one of the n sample values other than the last one of the n sample values, said second input of each one of said at least two comparators of said first type receiving the last one of the n sample values, each one of said at least two comparators of said first type having an output providing an output signal representing a logic one if the respective one of the n sample values is not greater than the last one of the n sample values, said output signal representing a logic zero otherwise;

said adder adding together a logic one and said output signal from said output of each one of said at least two comparators of said first type to obtain the result indicating the rank of the last one of the n sample values, said output of said adder providing the result indicating the rank of the last one of the n sample values;

a second device for determining a rank of a first one of the n sample values, said second device includes:

an adder having an output providing a result indicating the rank of the first one of the n sample values; and at least two comparators of a second type, each one of said at least two comparators of said second type having a first input and a second input, said first input of each one of said at least two comparators of said second type receiving a respective one of the n sample values other than the first one of the n sample values, said second input of each one of said at least two comparators of said second type receiving the first one of the n sample values, each one of said at least two comparators of said second type having an output providing an output signal representing a logic one if the respective one of the n sample values is less than the first one of the n sample values, said output signal of said one of said at least two comparators of said second type representing a logic zero otherwise;

said adder of said second device adding together a logic one and said output signal from said output of each one of said at least two comparators of said second type to obtain the result indicating the rank of the first one of the n sample values, said output of said adder of said second type providing the result indicating the rank of the first one of the n sample values; and at least one third device for determining a rank of an intermediate one of the n sample values, said third device includes:

an adder having an output providing a result indicating the rank of the intermediate one of the n sample values;

at least one comparator of a first type, each one of said at least one comparator of said first type having a first input and a second input, said first input of each one of said at least one comparator of said first type receiving a respective one of the n sample values that is precedent to the intermediate one of the n sample values, said second input of each one of said at least one comparator of said first type receiving the intermediate one of the n sample values, each one of said at least one comparator of said first type having an output providing an output signal representing a logic one if the respective one of the n sample values that is precedent to the intermediate one of the n sample values is not greater than the intermediate one of the n sample values, said output signal of said one of said at least one comparator of said first type representing a logic zero otherwise; and at least one comparator of a second type, each one of said at least one comparator of said second type having a first input and a second input, said first input of each one of said at least one comparator of said second type receiving a respective one of the n sample values that is subsequent to the intermediate one of the n sample values, said second input of each one of said at least one comparator of said second type receiving the intermediate one of the n sample values, each one of said at least one comparator of said second type having an output providing an output signal representing a logic one if the respective one of the n sample values that is subsequent to the intermediate one of the n sample values is less than the intermediate one of the n sample values, said output signal of said one of said at least one comparator of said second type representing a logic zero otherwise;

said adder of said third device adding together a logic one, said output signal from said output of each one of said at least one comparator of said first type, and said output signal from said output of each one of said at least one comparator of said second type to obtain the result indicating the rank of the intermediate one of the n sample values, said output of said adder of said third device providing the result indicating the rank of the intermediate one of the n sample values.

7. The rank ordered filter of claim 3 further comprising:

a plurality of said rank-determining devices;

each one of said plurality of said rank-determining devices utilizing self-threshold decomposition to determine a rank of a respective one of the sample values.

* * * * *